United States Patent [19]

Crawford

[11] Patent Number: 4,491,378
[45] Date of Patent: Jan. 1, 1985

[54] ZERO INSERTION FORCE ELECTRICAL CONNECTOR

[75] Inventor: Christopher L. Crawford, Harrisburg, Pa.

[73] Assignee: AMP Incorporated, Harrisburg, Pa.

[21] Appl. No.: 470,357

[22] Filed: Feb. 28, 1983

[51] Int. Cl.³ ............................................. H01R 13/629
[52] U.S. Cl. ............................ 339/75 MP; 339/17 CF
[58] Field of Search .......... 339/17 CF, 75 M, 75 MP, 339/176 M

[56] References Cited

U.S. PATENT DOCUMENTS

| | | | |
|---|---|---|---|
| 2,857,577 | 10/1958 | Vanderpool | 339/17 |
| 3,329,926 | 7/1967 | Aksu et al. | 339/176 |
| 3,474,387 | 10/1969 | Krum et al. | 339/75 |
| 3,753,211 | 8/1973 | Pauza et al. | 339/75 |
| 3,883,207 | 5/1975 | Tomkiewicz | 339/75 |
| 3,953,101 | 4/1976 | Palecek | 339/17 CF |
| 4,176,895 | 12/1979 | Aldridge | 339/17 CF |
| 4,189,199 | 2/1980 | Grau | 339/75 |
| 4,266,840 | 5/1981 | Seidler | 339/75 |
| 4,341,433 | 7/1982 | Cherian et al. | 339/17 CF |
| 4,349,238 | 9/1982 | Showman et al. | 339/75 |

FOREIGN PATENT DOCUMENTS

| | | | |
|---|---|---|---|
| 2312915 | 12/1976 | France | 339/17 CF |
| 2462795 | 2/1981 | France | 339/17 CF |
| 2008333 | 5/1979 | United Kingdom | 339/17 CF |

OTHER PUBLICATIONS

Western Electric Tech. Digest No. 27; Jul. 1972 "Dual In-Line Package"; Horn, W. E.

Primary Examiner—John McQuade
Attorney, Agent, or Firm—Robert W. J. Usher; F. Brice Faller

[57] ABSTRACT

A zero insertion force dual-in-line plug and socket assembly comprising a socket housing having spaced rows of finger-proof terminal-receiving compartments and a dual-in-line plug supported by an insulating carrier with barriers extending between and beyond respective plug leads defining a finger-proof enclosure. The dual-in-line plug assembly is receivably as a free fit between the compartment rows and the socket assembly includes a closure member having a series of cams which urge the terminals into engagement with the plug leads on movement to a closed condition. The terminals include sinuous intermediate portions to provide desired flexural characteristics.

6 Claims, 5 Drawing Figures

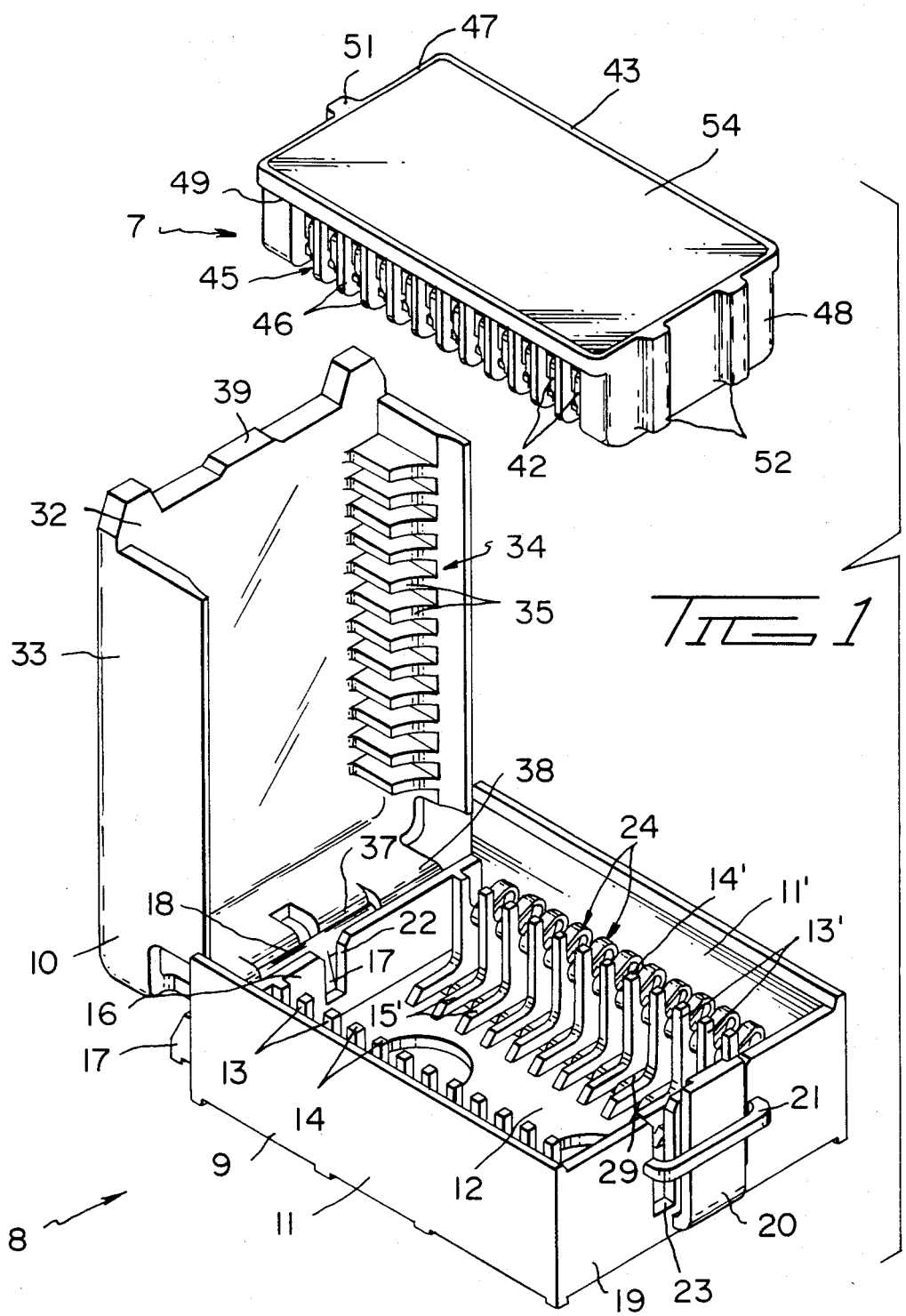

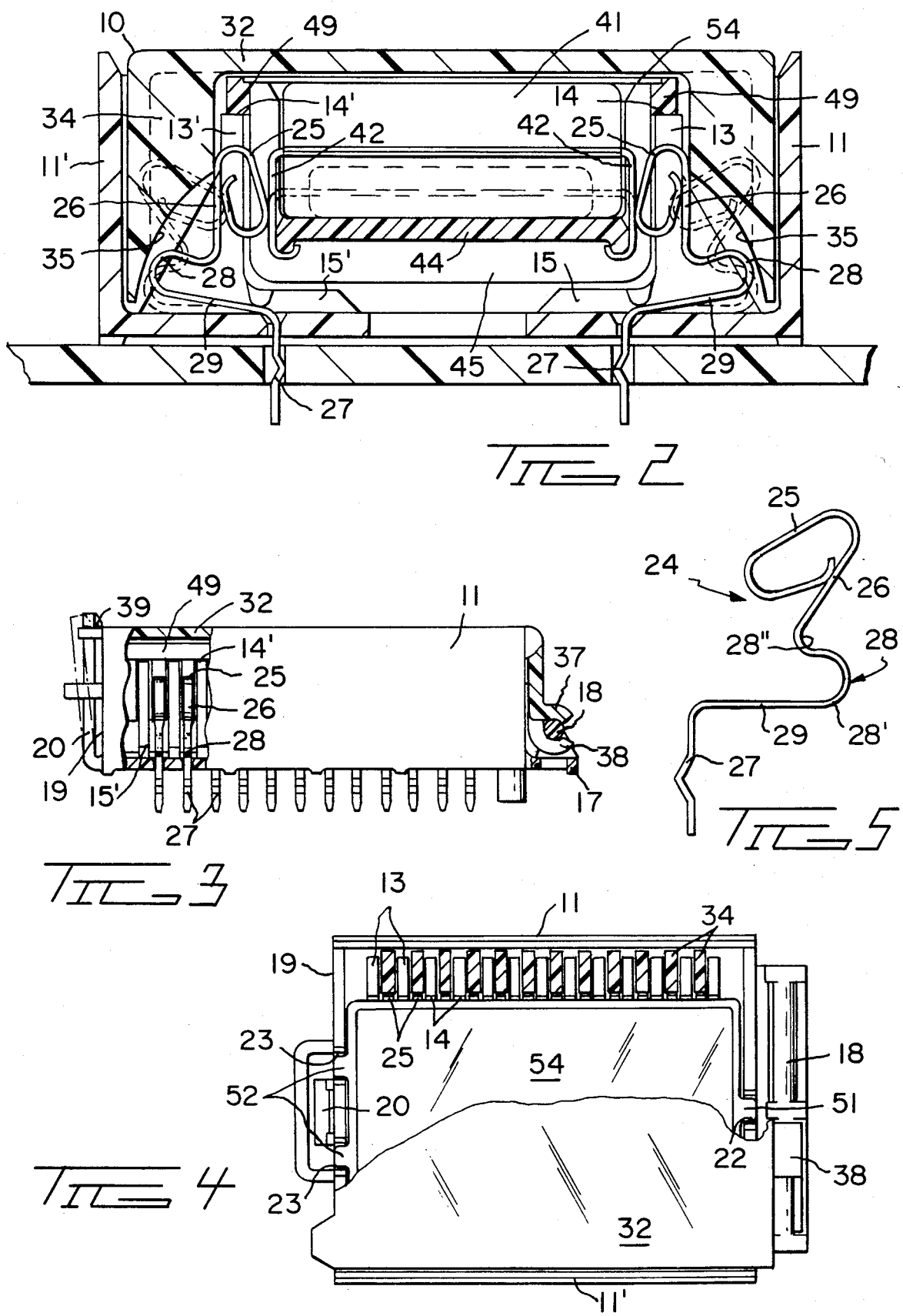

ZERO INSERTION FORCE ELECTRICAL CONNECTOR

The invention relates to dual-in-line plug and socket assemblies for printed circuit boards.

In particular, the invention relates to such assemblies which are suitable for use in applications, for example electronic games, where it is necessary repeatedly to insert and remove plug assemblies from the sockets by hand to reprogram a master unit enabling different games to be played.

To satisfy the requirements for repeated handling in a domestic environment, the assemblies should be robust and terminals of both the plug and socket should be protected from contact with the users hands which could destroy charge storage devices either in the plug or the master unit. In addition, the assemblies should be capable of being quickly mated by the operator (probably a child) without risk of damage to the terminals by forceful assembly of inadvertently misaligned parts.

According to the invention, there is provided a socket housing comprising a base and a cover mounted on one end of the base for pivotal movement towards and away from the base between open and closed conditions of the housing, the base having side walls and end walls respectively located in parallel, opposed, relation upstanding from a bottom wall and an open top, rows of closely spaced barriers upstand from the base wall at locations adjacent respective side walls and spaced from the respective side walls adjacent the top, adjacent barriers defining between them and the side walls finger-proof terminal receiving compartments, and the compartment rows defining between them an enclosure for receiving a dual-in-line plug as a free fit, terminals in respective compartments having contact portions supported by resilient arm portions upstanding from the anchoring portions in the base and the cover having rows of cam surfaces on respective opposite sides aligned with the terminals to urge the contact portions inwardly beyond the barriers into electrical contact with respective leads of dual-in-line plugs received in the enclosure.

The provision of the barriers ensures that an operators fingers cannot contact the terminals when the housing is in an open condition for receipt of dual-in-line plug assembly thereby avoiding risk of electrical damage to the master unit. In addition, insertion of the plug assembly with zero insertion force avoids any of risk asymmetrical contact forces during insertion which might otherwise produce misalignment, causing operator frustration and forceful application with consequential damage. Wear on the contact surfaces is also minimized by zero insertion force operation permitting multiple cycles with long connector life. Furthermore, as the cover is secured to the base, its correct alignment throughout movement to close the housing and effect connection to the plug assembly is assured. The pivotal movement of the cover provides sequential engagement with the terminals reducing the force needed to obtain connection.

The invention includes a combination of a socket housing as described above and a dual-in-line plug assembly comprising a dual-in-line plug supported by an insulating carrier having a series of barriers extending between and beyond respective leads in closely spaced apart relation to define a finger-proof enclosure.

When the contact portions of the terminals are urged by the cam surfaces of the cover inwardly from the compartments, they are received between adjacent barriers and engage the plug leads.

Preferably, the resilient arm portions have intermediate sinuous portions which provide very desirable resilient flexure without set whilst permitting the terminal to be of low height as required for printed circuit board applications.

Desirably, a portion of each arm between the intermediate portion and the anchoring portion extends laterally inwardly adjacent the base wall between ribs extending laterally inward along the base defining finger-proof extensions of the compartments, further increasing the effective spring length with minimal increase in the terminal height.

In a particular construction, the carrier is provided with a laterally projecting ledge extending longitudinally of respective opposite sides of the carrier above respective barriers and aligned with inner portions of the barriers for support thereby on receiving the dual-in-line plug in the enclosure.

The ledge facilitates location of the carrier in the base with the plug leads aligned with the contact portions of the terminals.

The cam surfaces may be concave ensuring a progressive camming action with minimal lateral movement of the terminals during initial stages of engagement with the cam surfaces. In addition, the cavity accommodates the sinuous portion of the terminal on the closed condition of the housing enabling an extremely compact structure to be obtained with good resilient properties.

It is known to mount a dual-in-line plug in a corner in which the plug leads are bent around a portion of the carrier body between respective laterally extending barriers to support the legs. However, the barriers do not protrude sufficiently beyond the leads to prevent finger engagement with the leads.

An example of the invention will now be described with reference to the accompanying drawings in which:

FIG. 1 is an exploded perspective view of a dual-in-line plug and socket assembly according to the invention;

FIG. 2 is a transverse cross-sectional view of the assembly;

FIG. 3 is a side elevation of the assembly of FIG. 2 partly broken away for clarity;

FIG. 4 is a plan view; and

FIG. 5 is an elevational view of a terminal of the assembly.

The socket assembly comprises a dual-in-line plug assembly 7 and a socket housing 8. The socket housing 8 comprises a base 9 and a cover 10 each moulded in one piece from plastics material.

The base is of open-top, box-like construction including opposed side walls 11, 11' upstanding from a bottom wall 12. Rows of protective barriers 13, 13' upstand from the base wall at locations adjacent and spaced inwardly from respective side walls, adjacent barriers in each row being in closely spaced apart relation providing between them finger-proof contact receiving compartments. The barriers extend laterally across the base to provide rows of plug supporting posts 14, 14' adjacent respective sidewalls 11, 11', the barriers 13, 13' tapering down sharply adjacent said posts 14, 14' to provide protective ribs 15, 15' toward the center of the base 9. The opposed rows of barriers 13, 13' define therebetween a cavity for receiving a dual-in-line plug as a free fit. A rear wall 16 of the base is integrally formed with externally rearwardly projecting lugs 17 between which extends a hinge pin 18. A front wall 19 carries a latching arm 20 which extends upwardly cantilever fashion from a location adjacent the base wall. A restraining bar 21 extends laterally behind the latching arm 20 to prevent overstress of the latching arm.

Two rows of terminals 24 are located in the base, each terminal being stamped and formed from sheet metal strip and comprising a contact portion 25, a resilient arm 26 supporting the contact portion and an anchoring portion 27 extending through an aperture in the base wall spaced from a side wall. The contact portion is of known type comprising a strip portion and reversely bent to form a closed loop extending inwardly flag fashion from the arm with the free end of the strip abutting the arm 26. The arm includes an intermediate portion 28 of sinuous shape, a long cantilever portion 29 of the arm between the intermediate portion 28 and the anchoring portion 27 extends transversely of the anchoring portion to lie flat against the bottom wall 12 between adjacent ribs 15'.

The intermediate portion has first and second arcuate parts 28', 28" adjacent the portions 29 and 25, respectively, the radius of part 28' extending inward therefrom toward the anchoring portion 27 while the radius of part 28" extends outward therefrom toward the adjacent sidewall 11, 11', respectively.

The cover 10 comprises a top wall 32 and opposite side walls 33 depending therefrom. A series of ramps 34 extend between the top wall and each side wall, leading ends of the ramps being provided with concave cam surfaces 35. Two pairs of hinges 37 and 38 extend from central and remote locations of one end of the cover receiving between them the hinge pin 18. The other end of the cover is provided with a latching projection 39.

The dual-in-line plug assembly 7 comprises a dual-in-line plug 41 having two rows of depending leads 42 and an insulating one-piece carrier 43.

The carrier 43 is of generally channel-section having a base wall 44 and side walls 45 formed as a series of closely spaced barriers 46 and end walls 47 and 48. The barriers 46 protrude laterally beyond and below the base wall 44 to provide a finger-proof enclosure. The end walls are joined by a longitudinally extending rim 49 which protrudes laterally beyond the barriers. Polarizing projections 51 and 52 complimentary to the polarizing recesses 22 and 23 are provided on the respective end walls 47, 48.

The plug 41 is assembled with the carrier 43 by inserting the plug body in the channel with the leads extending between respective adjacent pairs of barriers 13, 13' and bending the leads around opposite sides of the base. A cover 54 carrying identifying marking may be located on the top of the carrier.

The plug assembly can readily be inserted in the socket base enclosure with the rim 49 resting on the surfaces 14, 14' and the leads aligned with the terminals 24. Closing the cover causes the cam surfaces 35 sequentially and progressively to engage the terminals 24 adjacent their contact portions 25 camming them up and in from the position shown in broken lines in FIG. 2 beyond the barriers into engagement with the respective plug leads 42.

The camming action causes complex distortion of the resilient portion 26 comprising an increase in radius of the arcuate portion 28" accompanied by a decrease in radius of the arcuate portion 28' and flexure of the cantilever portion 29 away from the base wall. In consequence, the contact portion 25 is tilted from an inclined position into a preferred upright position for engagement with the plug leads. The distortion is distributed over substantially the entire length of the resilient arm 26 and the increasing and decreasing radii of the arcuate parts 28", 28' respectively are self-compensating to provide good spring characteristics with minimal variations in height.

When the cover 7 is pressed home the latch elements 20 and 39 interengage to lock the housing 8 in the closed condition. Release of the plug assembly may be achieved simply by finger pressure on the latch arm 20 to unlatch the cover. Raising the cover permits the terminals to resile back into the finger-proof compartments.

Engagement of the operators fingers with the plug leads and the terminals is prevented at all times by the finger-proof barriers.

It should be noted that the carrier channel may be sufficiently deep to accommodate dual-in-line plugs of the different standard dimensions obviating a requirement for a plurality of moulds. A smaller standard plug is indicated in broken lines in FIG. 2, for example.

I claim:

1. A socket housing comprising:
   a base having opposed parallel sidewalls and opposed parallel endwalls upstanding from a bottom wall and an open top, rows of closely spaced barriers upstanding from the bottom wall substantially perpendicular to adjacent sidewalls and spaced therefrom adjacent the top, adjacent barriers and sidewalls defining therebetween finger proof terminal receiving compartments, opposed rows defining therebetween a cavity for receiving a dual-in-line plug as a free fit,
   terminals in respective compartments having anchoring portions in said bottom wall, contact portions remote therefrom, but not extending beyond said barriers, and resilient arm portions therebetween, each said resilient arm portion comprising a cantilever portion extending outward from the anchoring portion toward the adjacent sidewall and an intermediate portion of sinuous shape between the cantilever portion and the contact portion, and
   a cover having rows of cam surfaces aligned with respective terminals to urge the contact portions beyond the barriers and into electrical contact with respective leads of a dual-in-line plug received in the cavity as the cover is placed on top of the base.

2. A socket housing according to claim 1 in which the cam surfaces are concave.

3. In combination, a socket housing according to claim 1 and a dual-in-line plug assembly comprising a dual-in-line plug supported by an insulating carrier having a series of barriers extending between respective leads in closely spaced apart relation to define a finger-proof enclosure.

4. A combination according to claim 3 in which the carrier is provided with a laterally projecting ledge extending longitudinally of respective opposite sides of the carrier above respective barriers and aligned with the inner portions of the barriers for support thereby on receiving the dual-in-line plug in the enclosure.

5. A socket as in claim 1 wherein said intermediate portion of each terminal comprises a first arcuate part having a radius, extending inward therefrom toward the anchoring portion and a second arcuate part having a radius extending outward therefrom toward the adjacent sidewall, the radius of said first arcuate part decreasing and the radius of said second arcuate part increasing as said cover is applied and said contact portions are deflected inward.

6. A combination according to claim 3 in which the barriers of the base each provide a plug supporting post at the top, the carrier having a laterally projecting ledge on opposite sides thereof aligned with the posts for support.

* * * * *